(12) United States Patent
Chan

(10) Patent No.: US 6,682,861 B2
(45) Date of Patent: Jan. 27, 2004

(54) DISPOSABLE HARD MASK FOR PHASE SHIFT PHOTOMASK PLASMA ETCHING

(75) Inventor: David Y. Chan, Austin, TX (US)

(73) Assignee: Photronics, Inc., Brookfield, CT (US)

( * ) Notice: Subject to any disclaimer, the term of this patent is extended or adjusted under 35 U.S.C. 154(b) by 0 days.

(21) Appl. No.: 10/370,408

(22) Filed: Feb. 19, 2003

(65) Prior Publication Data

US 2003/0186137 A1 Oct. 2, 2003

Related U.S. Application Data

(63) Continuation-in-part of application No. 10/234,790, filed on Sep. 3, 2002, which is a continuation of application No. 09/409,454, filed on Oct. 29, 2002, now Pat. No. 6,472,107.

(51) Int. Cl.[7] .............................. G03F 9/00; G03C 5/00
(52) U.S. Cl. ......................... 430/5; 430/313; 430/316; 430/317; 430/318; 430/323; 430/396
(58) Field of Search .......................... 430/5, 313, 316, 430/317, 318, 323, 396

(56) References Cited

U.S. PATENT DOCUMENTS

| | | |
|---|---|---|
| 4,178,403 A | 12/1979 | Sakurai et al. |
| 4,556,608 A | 12/1985 | Kaneki et al. |
| 4,720,442 A | 1/1988 | Shinkai et al. |
| 5,451,543 A | 9/1995 | Woo et al. |
| 5,460,908 A | 10/1995 | Reinberg |
| 5,482,799 A | 1/1996 | Isao et al. |
| 5,578,402 A | 11/1996 | Watanabe |
| 5,693,568 A | 12/1997 | Liu et al. |
| 5,725,973 A | 3/1998 | Han et al. |
| 5,756,396 A | 5/1998 | Lee et al. |
| 5,939,227 A | 8/1999 | Smith |
| 5,955,222 A | 9/1999 | Hibbs et al. |
| 6,544,696 B2 | 4/2003 | Westerman et al. |

*Primary Examiner*—Mark F. Huff
*Assistant Examiner*—Saleha R. Mohamedolla
(74) *Attorney, Agent, or Firm*—Amster, Rothstein & Ebenstein LLP

(57) ABSTRACT

A method for creating a phase shift photomask which includes a layer of hard mask material, the inclusion of which improves the uniformity of critical dimensions on the photomask by minimizing the affect of macro and micro loading. The method for producing the phase shift photomask of the instant invention includes two etching processes. The first etching process etches the layer of hard mask, and the second etching process etches opaque material (and anti-reflective layer, if used) and phase shift layers.

45 Claims, 10 Drawing Sheets

DISPOSABLE HARD MASK FOR PHASE SHIFT PHOTOMASK PLASMA ETCHING

CROSS-REFERENCE TO RELATED APPLICATION

This patent application is a continuation-in-part of co-pending U.S. application Ser. No. 10/234,790, filed Sep. 3, 2002, and entitled "DISPOSABLE HARD MASK FOR PHOTOMASK PLASMA ETCHING", which is a continuation of U.S. application Ser. No. 09/409,454, now U.S. Pat. No. 6,472,107, issued Oct. 29, 2002, also entitled "DISPOSABLE HARD MASK FOR PHOTOMASK PLASMA ETCHING", the contents of which are incorporated herein by reference in their entirety.

FIELD OF THE INVENTION

The present invention relates to a photomask, either binary or phase shift, which includes a hard mask layer, the use of which improves the uniformity of critical dimensions on the photomask.

BACKGROUND OF THE INVENTION

Photomasks are used in the semiconductor industry to transfer microscale images defining a semiconductor circuit onto a silicon or gallium arsenide substrate or wafer. A typical binary photomask is comprised of a transparent quartz substrate and chrome (Cr) opaque material that includes an integral layer of chrome oxide (CrO) anti-reflective (AR) material. The pattern of the Cr opaque material and CrO AR material on the quartz substrate is a scaled negative of the image desired to be formed on the semiconductor wafer.

As shown in FIG. 1, a prior art blank photomask 20 is comprised of four layers. The first layer 2 is a layer of quartz, commonly referred to as the substrate, and is typically approximately one quarter inch thick. Affixed to the quartz substrate 2 is a layer of Cr opaque material 4 which typically is approximately 900 Å to 1000 Å thick. An integral layer of CrO AR material 6 is formed on top of the layer of Cr opaque material 4. The layer of CrO AR material is typically approximately 100 Å thick. A layer of photosensitive resist material 8 resides on top of the CrO AR material 6. The photosensitive resist material 8 is typically a hydrocarbon polymer, the various compositions and thicknesses of which are well known in the art.

The desired pattern of Cr opaque material to be created on the photomask may be defined by an electronic data file loaded into an exposure system which typically scans an electron beam (E-beam) or laser beam in a raster fashion across the blank photomask. One such example of a raster scan exposure system is described in U.S. Pat. No. 3,900,737 to Collier. As the E-beam or laser beam is scanned across the blank photomask, the exposure system directs the E-beam or laser beam at addressable locations on the photomask as defined by the electronic data file. The areas of the photosensitive resist material that are exposed to the E-beam or laser beam become soluble while the unexposed portions remain insoluble. As shown in FIG. 2, after the exposure system has scanned the desired image onto the photosensitive resist material, the soluble photosensitive resist is removed by means well known in the art, and the unexposed, insoluble photosensitive resist material 10 remains adhered to the CrO AR material 6.

As illustrated in FIG. 3, the exposed CrO AR material and the underlying Cr opaque material no longer covered by the photosensitive resist material is removed by a well known etching process, and only the portions of CrO AR material 12 and Cr opaque material 14 residing beneath the remaining photosensitive resist material 10 remain affixed to quartz substrate 2. This initial or base etching may be accomplished by either a wet-etching or dry-etching process both of which are well known in the art. In general, wet-etching process uses a liquid acid solution to erode away the exposed CrO AR material and Cr opaque material. A dry-etching process, also referred to as plasma etching, utilizes electrified gases, typically a mixture of chlorine and oxygen, to remove the exposed chrome oxide AR material and chrome opaque material.

A dry-etching process is conducted in vacuum chamber in which gases, typically chlorine and oxygen are injected. An electrical field is created between an anode and a cathode in the vacuum chamber thereby forming a reactive gas plasma. Positive ions of the reactive gas plasma are accelerated toward the photomask which is oriented such that the surface area of the quartz substrate is perpendicular to the electrical field. The directional ion bombardment enhances the etch rate of the Cr opaque material and CrO AR material in the vertical direction but not in the horizontal direction (i.e., the etching is anisotropic or directional).

The reaction between the reactive gas plasma and the Cr opaque material and CrO AR material is a two step process. First, a reaction between the chlorine gas and exposed CrO AR material and Cr opaque material forms chrome radical species. The oxygen then reacts with the chrome radical species to create a volatile which can "boil off" thereby removing the exposed CrO AR material and the exposed Cr opaque material.

As shown in FIG. 4, after the etching process is completed the photosensitive resist material is stripped away by a process well known in the art. The dimensions of the Cr opaque material on the finished photomask are then measured to determine whether or not critical dimensions are within specified tolerances. Critical dimensions may be measured at a number of locations on the finished photomask, summed, and then divided by the number of measurements to obtain a numerical average of the critical dimensions. This obtained average is then compared to a specified target number (i.e., a mean to target comparison) to ensure compliance with predefined critical dimensions specifications. Additionally, it is desired that there is a small variance among the critical dimensions on the substrate. Accordingly, the measured critical dimensions typically must also conform to a specified uniformity requirement. Uniformity is typically defined as a range (maximum minus minimum) or a standard deviation of a population of measurements.

Another type of known photomask used for transferring images to a semiconductor wafer is commonly referred to as a phase shift photomask. Phase shift photomasks are generally preferred over binary photomasks where the design to be transferred to the semiconductor wafer includes smaller, packed together feature sizes which are below the resolution requirements of optical equipment being used. Phase shift photomasks are engineered to be 180 degrees out of phase with light transmitted through etched areas on the photomask so that the light transmitted through the openings in the photomask is equal in amplitude.

One type of known phase shift photomask is commonly referred to as an embedded attenuated phase shift mask ("EAPSM"). As shown in FIG. 10, a typical blank EAPSM 31 is comprised of four layers. The first layer is a typically a substantially transparent material 33 (such as quartz, for example) and is commonly referred to as a substrate. The next layer is typically an embedded phase shifting material ("PSM layer") 35, such as molybdenum silicide (MoSi), tantalum silicon nitride (TaSiN), titanium silicon nitride (TiSiN) or zirconium silicon oxide (ZrSiO) and other known phase materials. The next layer is typically an opaque material 37, such as chromium, which may optionally include an anti-reflective coating such as chromium oxynitride (CrON). The top layer is a photosensitive resist material 39.

The method for processing a conventional EAPSM is now described. As with binary photomasks, the desired pattern of opaque material 37 to be created on the EAPSM 31 is scanned by an electron beam (E-beam) or laser beam in a raster or vector fashion across the blank EAPSM 31. As the E-beam or laser beam is scanned across the blank EAPSM 31, the exposure system directs the E-beam or laser beam at addressable locations on the EAPSM 31. The areas of the photosensitive resist material 39 that are exposed to the E-beam or laser beam become soluble while the unexposed portions remain insoluble.

As is done with binary photomasks and as shown in FIG. 11, after the exposure system has scanned the desired image onto the photosensitive resist material 39, the soluble photosensitive resist material is removed by means well known in the art, and the unexposed, insoluble photosensitive resist material 39' remains adhered to the opaque material 37. Thus, the pattern to be formed on the EAPSM 31 is formed by the remaining photosensitive resist material 39'.

The pattern is then transferred from the remaining photoresist material 39' to the opaque layer 37 and PSM layer 35 via the known etching techniques described above, with portions of the opaque layer 37 and PSM layer 35 not covered by the remaining photoresist 39' being etched away. After etching is completed, the remaining photoresist material 39' is stripped or removed and the EAPSM 31 is finished or completed, as shown in FIG. 12. In the finished EAPSM 31', the pattern as previously reflected by the PSM 35 and opaque 37 materials is located in regions where the remaining photoresist 39' remain after the soluble materials were removed in prior steps.

To create an image on a semiconductor wafer, the photomask (e.g., binary or phase shift) is interposed between the semiconductor wafer, which includes a layer of photosensitive material, and an energy source commonly referred to as a Stepper, as shown in FIG. 13. The energy generated by the Stepper passes through the transparent portions of the substantially transparent substrate not covered by the opaque material (and, if utilized, the anti-reflective and/or phase shift material) and causes a reaction in the photosensitive material on the semiconductor wafer. It is noted that anti-reflective material is useful in preventing most, but not all, of the incident energy from being reflected back into the Stepper. If excess energy is reflected back into the Stepper a degraded image will be created in the photosensitive resist material on the semiconductor wafer surface, thereby resulting in a degradation of performance of the semiconductor device. Energy from the Stepper is inhibited from passing through the areas of the photomask in which the opaque material.

The etch rate of the plasma etching process described above (and hence the uniformity of the critical dimensions) is dependent on the desired pattern to be formed in the opaque material (anti-reflective material, if used) and phase shift material (in the case of an EAPSM). In areas of the photomask (either binary or phase shift) where a substantial portion of opaque material and phase shift material (and anti-reflective materials, if used) are to be removed (i.e., macro loading), the etching process may take longer than in areas of the photomask in which small portions of opaque material and phase shift material (and anti-reflective material, if used) are to be removed. Likewise, there may be differences in etch rate for micro loading conditions in which the etch rate is different between isolated and dense features in the same general area. These differing etch rates make it more difficult for the finished photomask to conform to a specified uniformity requirement. Additionally, the above described etching process can also cause variances in critical dimensions because the photosensitive resist material is not entirely impervious to the plasma gases.

While the prior art is of interest, the known methods and apparatus of the prior art present several limitations which the present invention seeks to overcome.

Accordingly, it is an object of the present invention to provide a blank phase shift photomask which includes a layer of hard mask material thereby enabling the critical dimensions of a finished photomask to be more uniform.

It is a further object of the invention to provide a method for manufacturing a finished phase shift photomask having improved uniformity of critical dimensions.

It is still further an object of the present invention to provide a finished phase shift photomask having improved uniformity in critical dimensions and improved anti-reflection properties thereby reducing the amount of error introduced by the basic lithography process.

It is another object of the present invention to solve the shortcomings of the prior art.

Other objects and advantages of the present invention will become apparent from the foregoing description.

SUMMARY OF THE INVENTION

It has now been found that the above and related objects of the present invention are obtained in the form of several related aspects, including an improved blank EAPSM, a method for forming an image on the blank EAPSM, a finished EAPSM, and a method of making a semiconductor or integrated circuit using the finished EAPSM.

The blank EAPSM comprises a photosensitive resist material layer, a hard mask layer underlying the photosensitive resist material layer, an opaque layer underlying the hard mask layer, a phase shift layer underlying the opaque layer and a substantially transparent substrate layer underlying the phase shift layer. The hard mask layer is made from materials which are selectively resistant to etching in the blank photomask. The opaque layer may optionally include an anti-reflective layer if needed or desired.

The method for creating an image on the EAPSM of the present invention comprises the steps of: creating a patterned image in the photosensitive resist layer; removing portions of the photosensitive resist layer that do not correspond to the patterned image thereby exposing portions of the hard mask layer not corresponding to the patterned image; removing the exposed portions of the hard mask layer that do not correspond to the patterned image thereby exposing portions of the opaque layer not corresponding to the patterned image; removing the exposed portions of the opaque and the phase shift layer underlying the hard mask portions that do not correspond to the patterned image thereby exposing portions of the substantially transparent layer that do not correspond to the patterned image; and removing the photosensitive resist layer. Where the EAPSM of the present invention includes an anti-reflective layer, the method of the present invention further comprises the step of removing the anti-reflective layer after the hard mask layer is removed (either prior to removing the opaque layer or together with the opaque layer).

The finished EAPSM made by the above method comprises a substantially transparent substrate; a patterned layer of phase shift material affixed to the substrate; a patterned layer of opaque material (and anti-reflective material, if used or needed) affixed to the patterned layer of phase shift material; and a patterned layer of hard mask material affixed to the layer of the opaque material (or anti-reflective layer, if used), wherein the pattern formed in the phase shift material, opaque material and the hard mask material corresponds to a scaled negative or positive of the image to be formed on the image plane.

The method for manufacturing a semiconductor using the finished EAPSM of the present invention comprises the steps of: interposing a finished EAPSM between a semiconductor wafer and an energy source; generating energy in the energy source; transmitting the generated energy through a pattern formed in the EAPSM; and etching an image on the semiconductor wafer corresponding to the pattern formed in the opaque and the hard mask layers of the finished photomask. The finished EAPSM comprises a substantially transparent substrate, a patterned layer of phase shift material affixed to the substantially transparent substrate, a patterned layer of opaque material affixed to the phase shift material, and a patterned layer of hard mask material affixed to the layer of opaque material. The pattern formed in the phase shift layer, opaque layer and hard mask layer corresponds to either a scaled negative or positive of the image to be formed on the image plane.

BRIEF DESCRIPTION OF THE DRAWINGS

The above and related objects, features and advantages of the present invention will be more fully understood by reference to the following, detailed description of the preferred, albeit illustrative, embodiment(s) of the present invention when taken in conjunction with the accompanying figures, wherein.

DETAILED DESCRIPTION OF THE INVENTION

Figure 5:
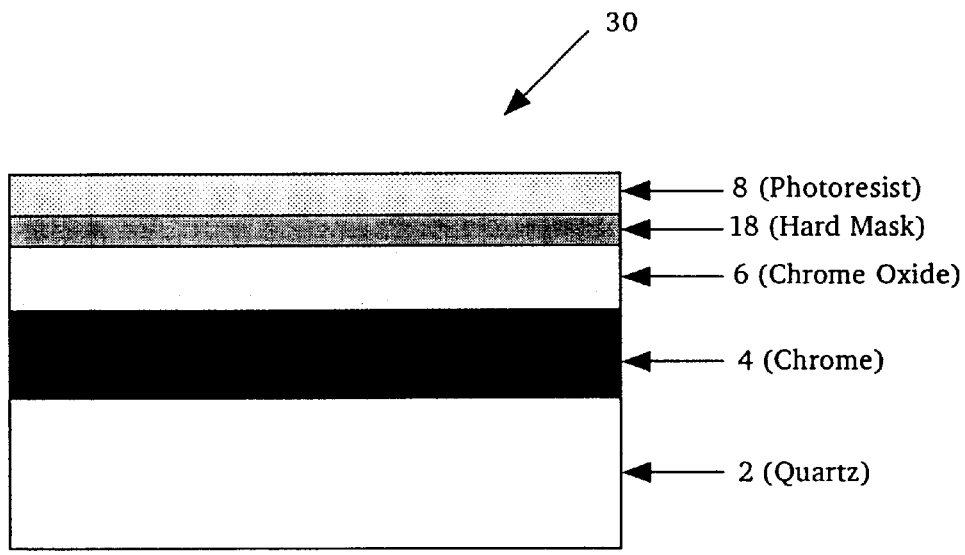
FIG. 5 is a cross-sectional view of a blank photomask in accordance with the instant invention illustrating the composition of the various layers of a typical blank photomask including a hard mask layer.

FIG. 5 depicts a blank photomask in accordance with the present invention. As shown the blank photomask 30 is comprised of a quartz substrate 2 having a thickness of approximately one quarter inch. Affixed to quartz substrate 2 is a layer of Cr opaque material 4 which is typically 900 Å to 1000 Å thick. An integral layer of CrO AR material 6, typically approximately 100 Å thick, is formed on top of the Cr opaque material 4. Hard mask layer 18 is deposited on top of the CrO AR material 6. The hard mask layer 18 may be deposited on the CrO AR layer using a sputtering process or any other method well known in the art such as chemical vapor deposition (CVD). The thickness of the hard mask layer is preferably in the range of 50 to 500 Å, and is most preferably approximately 250 Å thick. In the preferred embodiment, the hard mask layer is comprised of silicon (Si). However, the hard mask layer may also be comprised of other similar materials including but not limited to Ti, TiW, W, TiN, $Si_3N_4$, $SiO_2$, or spin-on-glass.

Figure 6:
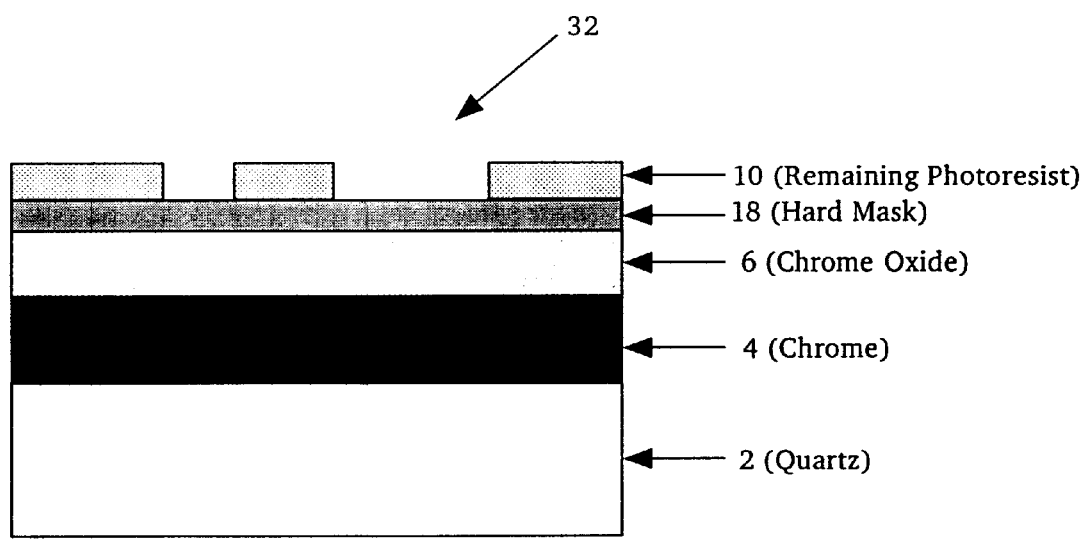
FIG. 6 is a cross-sectional view of a photomask in accordance with the instant invention after exposure to an energy source and having the soluble photosensitive material removed.

The process for creating a finished photomask, having improved critical dimensions and anti-reflective properties, from blank photomask 30 is now described with reference to FIGS. 5 through 9. Initially, the desired pattern to be formed in the hard mask material 18, the CrO AR material 6, and the Cr opaque material 4 is scanned onto the layer of photosensitive resist material 8 of blank photomask 30 by means of a raster scan exposure system, or comparable system (e.g., a vector scan tool). The portions of the photosensitive resist material that are exposed to the E-beam or laser beam become soluble while the unexposed portions remain insoluble. As shown in FIG. 6, after the exposure system has scanned the desired image onto the photosensitive resist material, the soluble photosensitive resist is removed by means well known in the art exposing areas of hard mask material 18, and the unexposed, insoluble photosensitive resist material 10 remains adhered to, and covering, other areas of the hard mask material 18.

Figure 7:
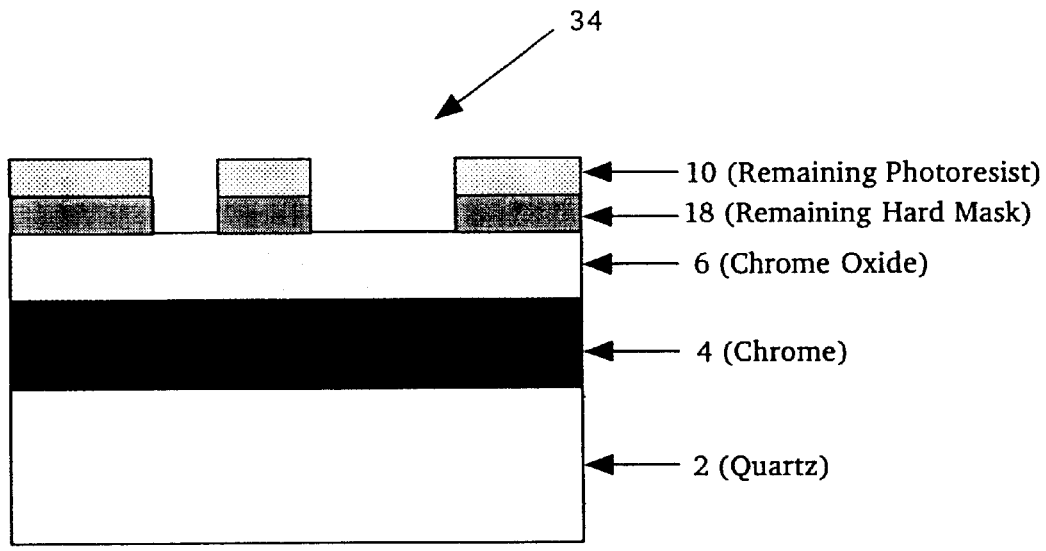
FIG. 7 is a cross-sectional view of a photomask in accordance with the instant invention after being subjected to a first etching process thereby removing the exposed hard mask material.

Photomask 32 of FIG. 6 is next subjected to a first etching process to remove the exposed hard mask material. In the preferred embodiment where the hard mask is comprised of Si, the composition of the plasma gas has either a fluorine, chlorine, or bromine containing species or a combination of various halide containing species such as, but not limited to, $C_2F_6$, $CHF_3$, $Cl_2$, HBr, or $SF_6$. In the preferred embodiment, $Cl_2$ plasma gas is used to etch the Si hard mask. This is advantageous since the same chamber can be used to etch both the hard mask and the Cr and CrO materials without the need for any additional gas hookups. The $C_2F_6$, $CHF_3$, HBr, $Cl_2$, or $SF_6$ plasma gases etch the exposed Si hard mask material in a similar manner as described above with respect to the plasma etching of the Cr and CrO AR material. Silicon halides are volatile and they will be readily removed once formed. However the $C_2F_6$, $CHF_3$, HBr, $Cl_2$, or $SF_6$ plasma gases do not significantly react with the underlying Cr and CrO AR material. Thus, as shown in FIG. 7, only the portions of the exposed hard mask material 18 are removed by the first etching and those portions of the hard mask material underlying the photosensitive resist material 10 are not significantly affected. As shown in FIG. 7, the first etching process exposes those areas of the Cr opaque material and CrO AR material not underlying photosensitive resist material 10 and hard mask material 18.

Photomask 34 of FIG. 7 is next subjected to a second etching process to remove the Cr and CrO layers. The etching process may be conducted with the photosensitive resist material in place, or the photosensitive resist material can be stripped away prior to commencement of the second etching process. As described above, the second etching process is conducted in vacuum chamber in which chlorine and oxygen gases are injected. An electrical field is created between and anode and a cathode in the vacuum chamber thereby forming a reactive gas plasma, and positive ions of the reactive gas plasma are accelerated toward photomask, which is at the same potential as the cathode, and which is oriented such that the surface area of quartz substrate is perpendicular to the electrical field. The reaction between the reactive gas plasma and the Cr opaque material and CrO AR material is a two step process. First, a reaction between the chlorine gas and exposed CrO AR material and Cr opaque material forms chrome radical species. The oxygen then reacts with the chrome radical species to create a volatile which can "boil off" thereby removing the exposed CrO AR material and the exposed Cr opaque material.

It will be appreciated by those skilled in the art that through modification of the chlorine to oxygen ratio, one can retain the hard mask material through the second etch process step. Accordingly, the second etching process can be extended to overcome the effects of macro loading. In other words, the effect of the differing etch rates in areas of photomask 34 having large portions of Cr material and CrO AR material to be removed verses those areas in which only small portions of Cr and CrO AR materials are removed, can be eliminated. Additionally, with prior art photomasks which do not have a hard mask layer, the duration of the etching process is time critical due to the effects of the plasma gases on the photosensitive resist material. That is, as the Cr and CrO is being etched away, the plasma gases are also reacting with the photosensitive material, and if the etching process is continued for too long a period, the photosensitive material may no longer protect the underlying portions of the Cr and CrO AR material from the plasma gases. In short, unlike the etching of prior art photomasks which do not include a layer of hard mask material, the second etching process can be extended in time to ensure that essentially all the exposed Cr and CrO AR materials are removed.

Figure 8:
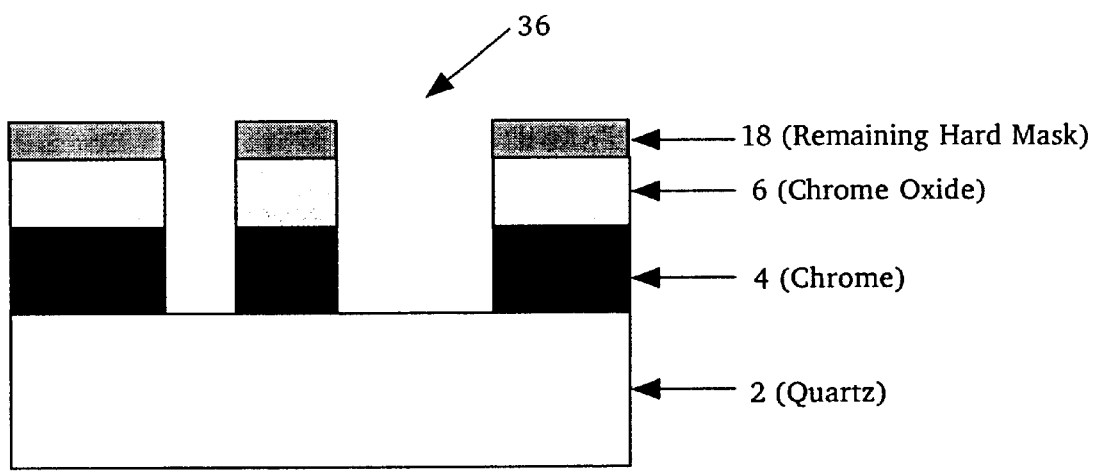
FIG. 8 is a cross-sectional view of a finished photomask in accordance with the first embodiment of the invention after being subjected to a second etching process thereby removing the exposed CrO AR material and Cr opaque material.

As shown in FIG. 8, the second etching process results in the exposure of only those portions of the quartz substrate 2 which correspond to the pattern originally scanned into the photosensitive material. After completion of the photosensitive material 10 may be stripped away by a process well known in the art, if not already done so prior to the commencement of the second etching process. As shown in FIG. 8, the resulting photomask 36 of a first embodiment of the instant invention having improved uniformity of critical dimensions is comprised of a quartz substrate 2 and patterned layers of Cr opaque material 4, CrO AR material 6, and hard mask material 18. In this first embodiment of the instant invention, hard mask material 18 remains an integral part of the deliverable photomask. This embodiment of the invention is advantageous in that the hard mask material has a de minimis thickness but, depending on its composition, may exhibit excellent anti-reflective characteristics. Hard mask materials of Ti, TiN, TiW, W, and Si exhibit good anti-reflective properties, while hard mask materials of $Si_3N_4$, spin-on-glass, and $SiO_2$ do not exhibit anti-reflective properties.

Figure 9:
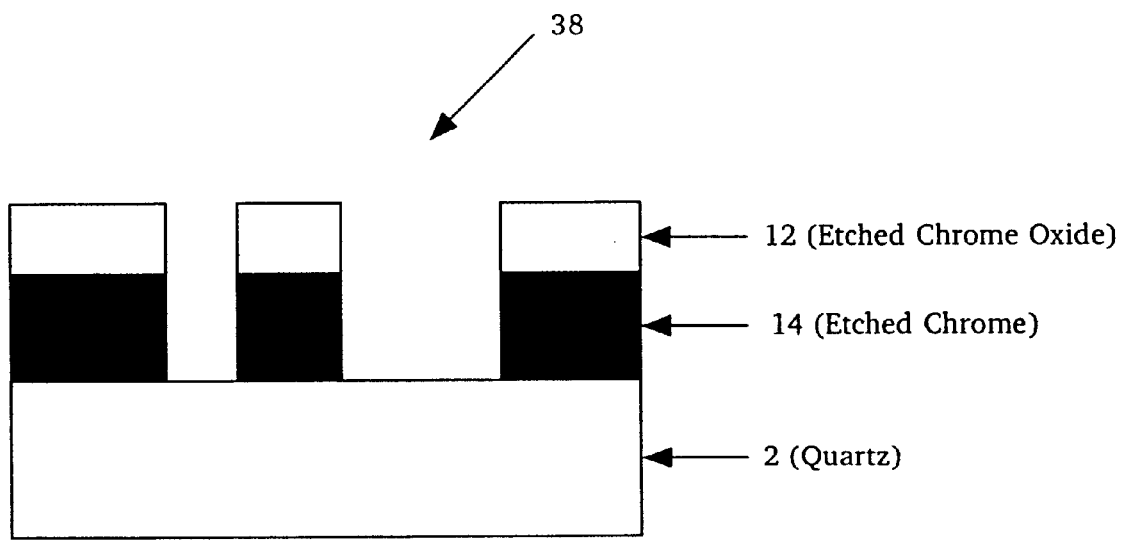
FIG. 9 is cross-sectional view of a second embodiment of a finished photomask is accordance with the present invention.
Figure 10:
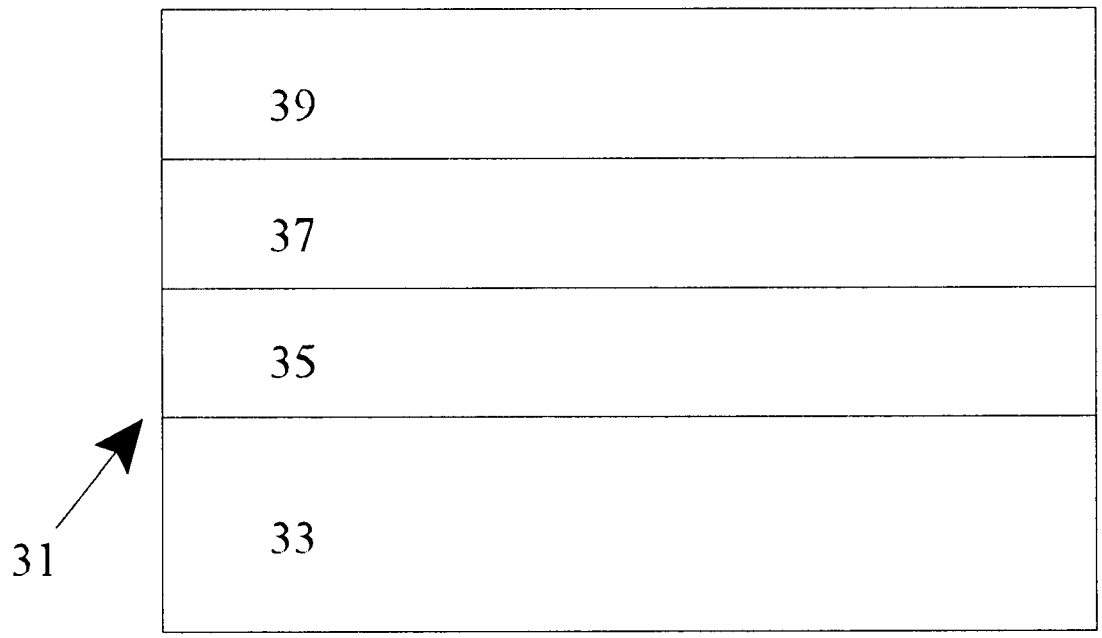
FIG. 10 is a cross-sectional view of a prior art blank EAPSM illustrating the composition of the various layers of such photomask.
Figure 11:
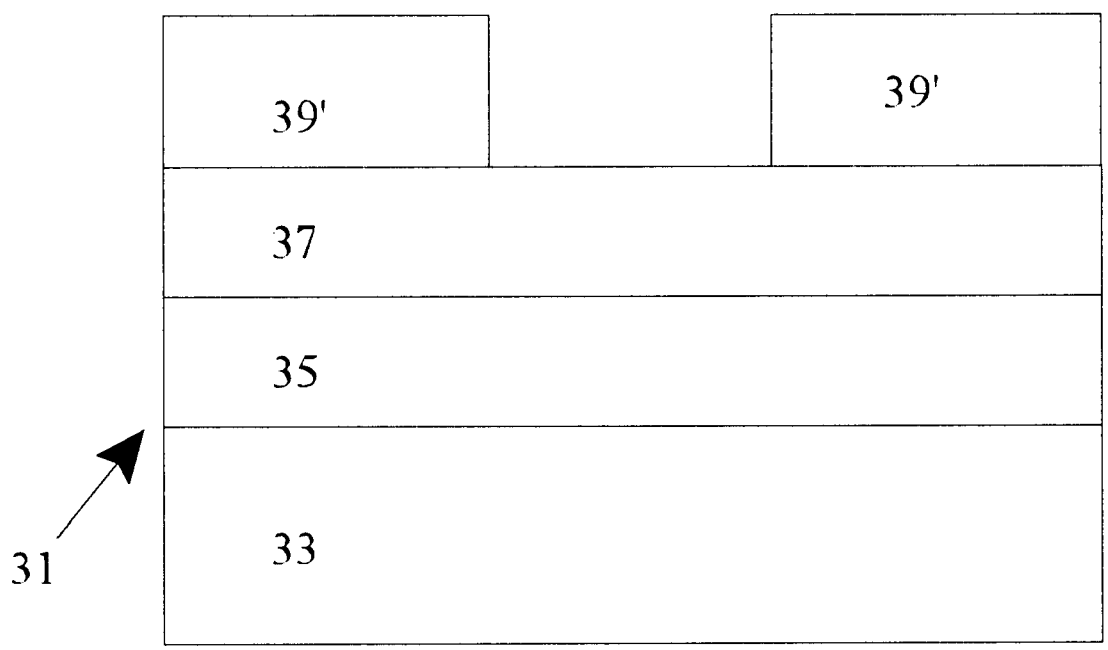
FIG. 11 is a cross-sectional view of the prior art EAPSM shown in FIG. 10 after exposure to an energy source and removal of the soluble photosensitive material.
Figure 12:
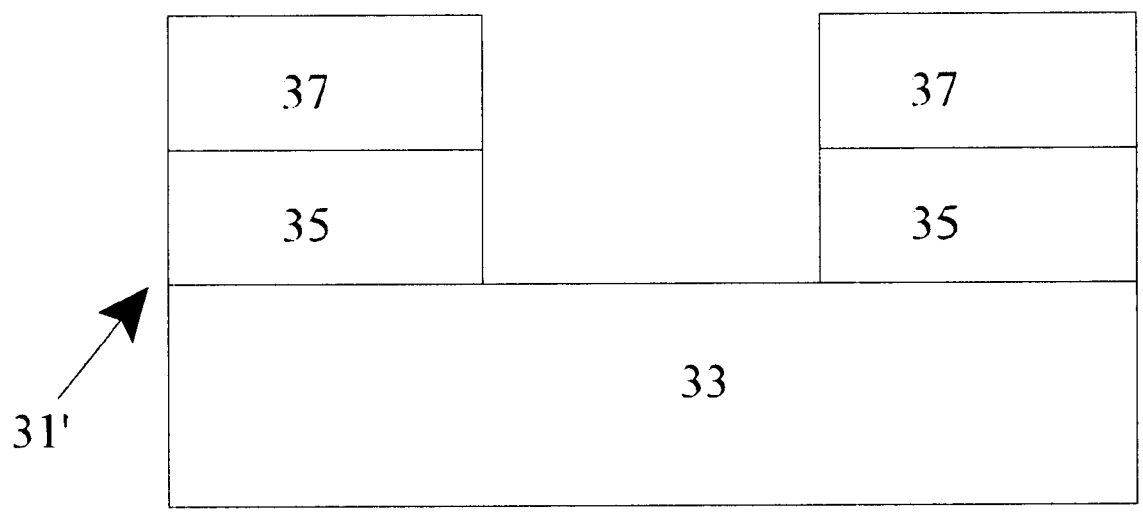
FIG. 12 is a cross-sectional view of the prior art EAPSM of FIGS. 10–11 after being subjected to an etching process thereby removing the exposed opaque and phase shift layers.
Figure 13:
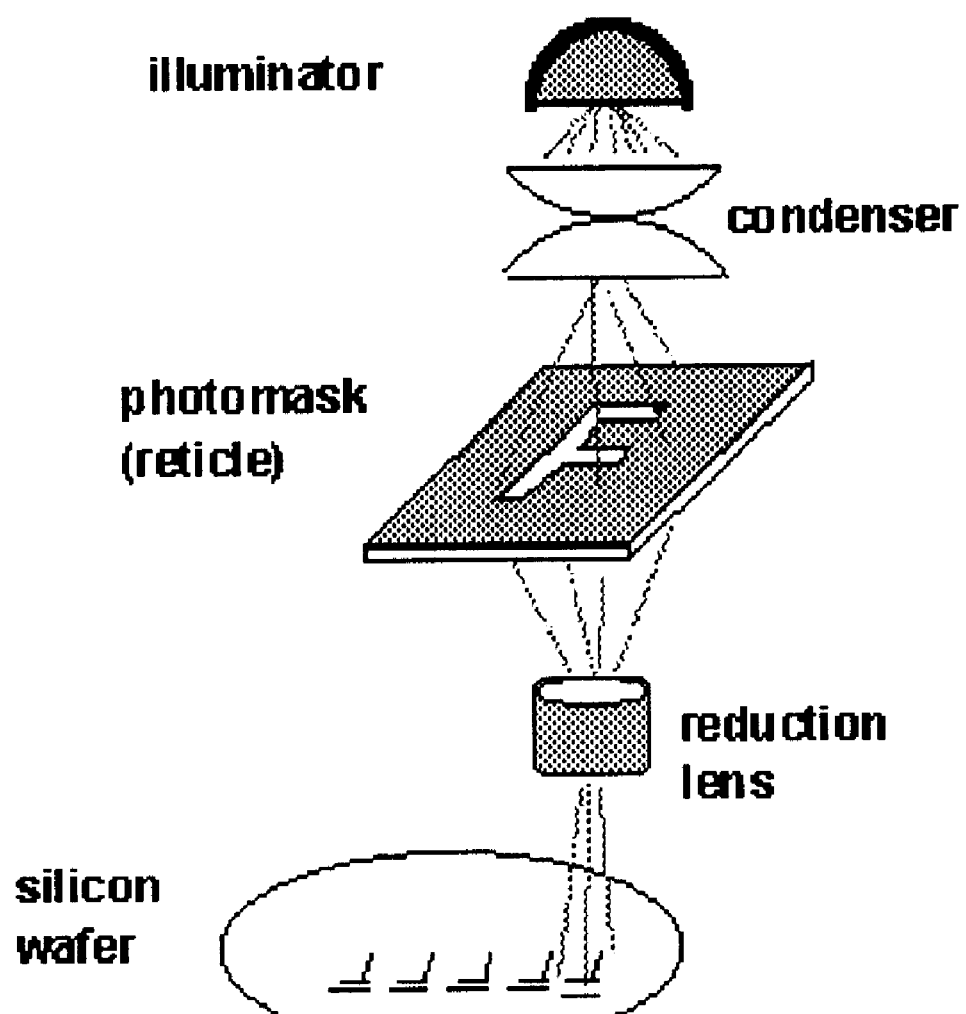
FIG. 13 illustrates one example by which a photomask (either binary or phase shift) can be used to manufacture a semiconductor.

Alternatively, in a second embodiment of the instant invention shown in FIG. 9, the hard mask 18 can be stripped away using wet or dry etching methods. For example, an aqueous KOH solution can be used to strip away the silicon hard mask. Thus, as should be appreciated, the etching techniques described herein are merely exemplary and are in no way intended to be all inclusive. Thus, other etching techniques, including the use of other chemicals and/or gases not explicitly disclosed herein, can also be used to form a pattern on the photomask of the present invention. Of course, such etching techniques should be used in a manner so as to retain the hard mask material through the second etching process step.

Figure 1:
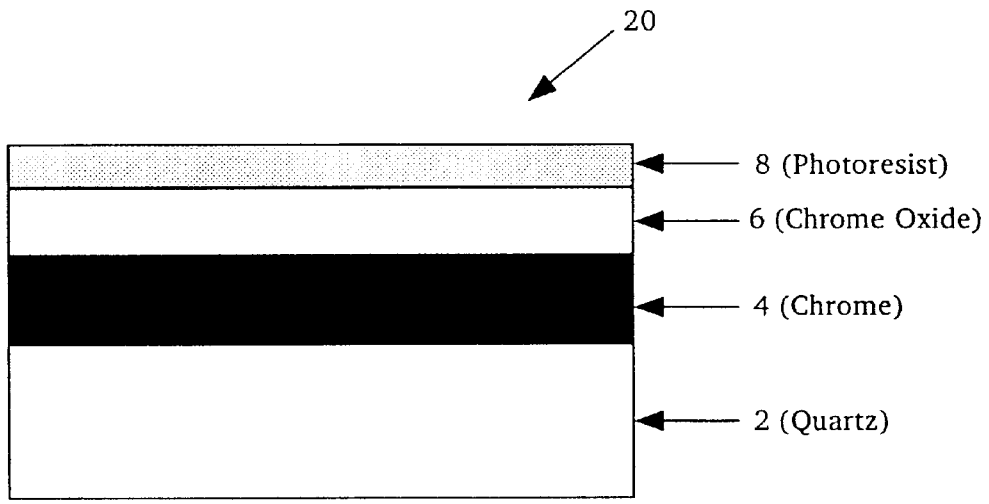
FIG. 1 is a cross-sectional view of a blank photomask illustrating the composition of the various layers of a typical prior art blank binary photomask.
Figure 2:
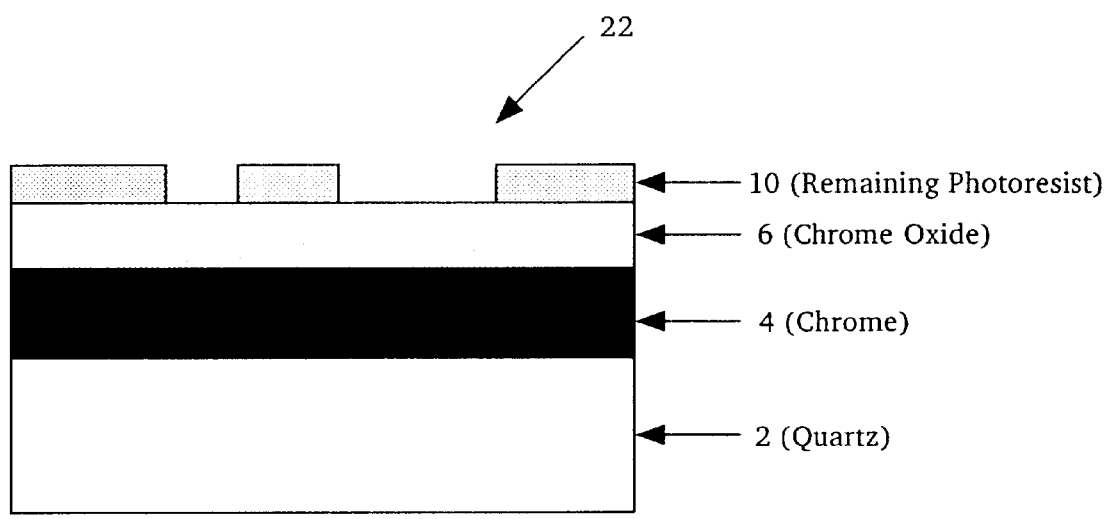
FIG. 2 is a cross-sectional view of a prior art photomask after exposure to an energy source and having the soluble photosensitive material removed.
Figure 3:
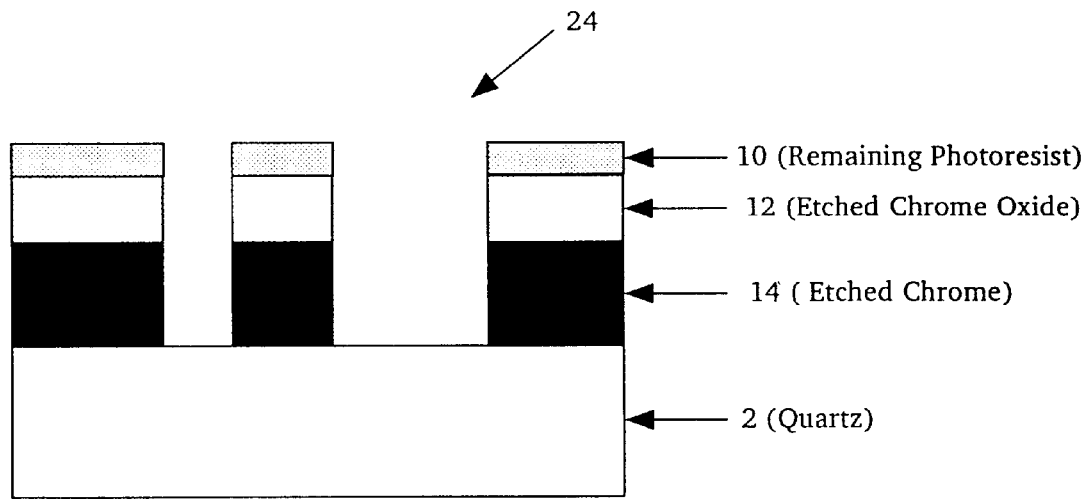
FIG. 3 is a cross-sectional view of a prior art binary photomask after being subjected to an etching process thereby removing the exposed CrO AR material and Cr opaque material.
Figure 4:
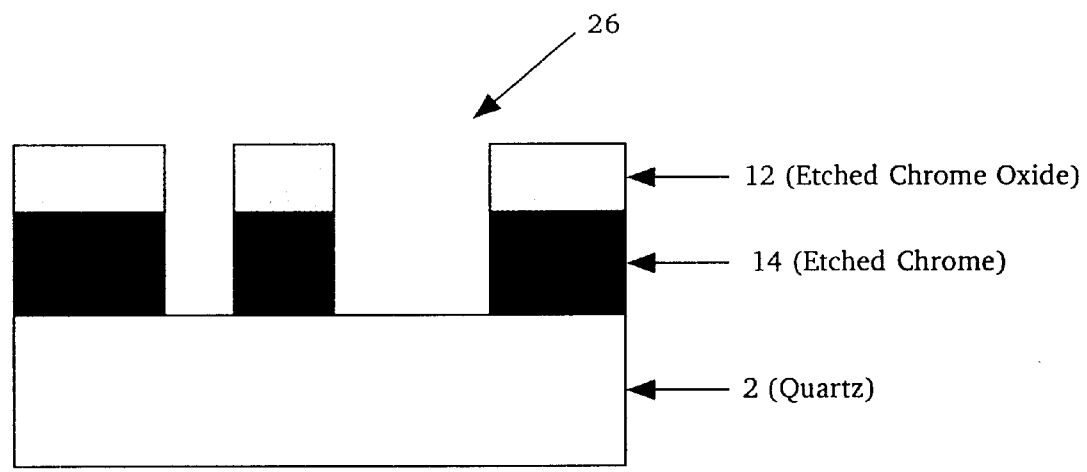
FIG. 4 is a cross-sectional view of a finished, prior art binary photomask with the photosensitive material stripped away.

Although the photomask 38 of FIG. 9 appears substantially identical to the prior art photomask shown in FIG. 4, those skilled in the art will appreciate that the critical dimensions of photomask 38 made in accordance with the instant invention will have improved uniformity in critical dimensions.

Figure 14:
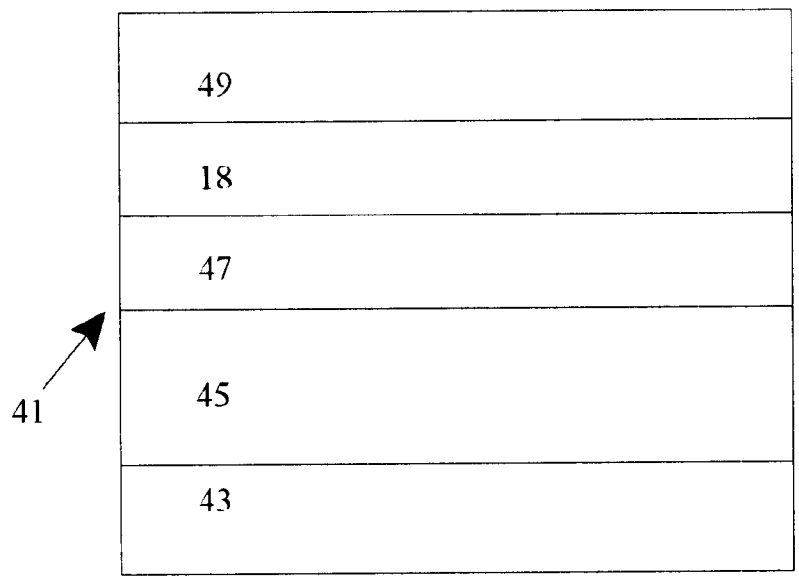
FIG. 14 is a cross sectional view of a blank EAPSM having a hard mask layer in accordance with the present invention.

Although the instant invention has been described with respect to the particular embodiment of typical binary masks being comprised of Cr and CrO materials, those skilled in the art will appreciate that the instant invention can be used with photomask of different types including Phase Shift masks (PSM) and Next Generation Lithography (NGL) masks where the invented hard mask approach will benefit the manufacturability of these masks. More particularly, the use of a hard mask 18 as described above with respect to a binary photomask could be similarly used in an EAPSM. In this regard, as shown in FIG. 14, a blank EAPSM 41 according to the present invention includes a substantially transparent layer 43, such as quartz or other similar transmissive materials. The EAPSM 41 also includes a PSM layer 45, such as molybdenum silicide (MoSi), tantalum silicon nitride (TaSiN), titanium silicon nitride (TiSiN), zirconium silicon oxide (ZrSiO) and other known or hereinafter developed phase shifting materials. The next layer is an opaque material 47, such as chromium, which may optionally include an anti-reflective coating, such as chromium oxynitride (CrON) or chromium oxide (CrO), for example. The next layer is a hard mask layer 18, which as described above, may be silicon (Si). The top layer is a photosensitive resist material 51.

It should be noted that although the hard mask layer 18 is comprised of silicon (Si) in a preferred embodiment, the hard mask layer may also be comprised of other similar materials, including, but not limited to, Ti, TiW, W, TiN, $Si_3N_4$, $SiO_2$, and spin-on-glass. Additionally, in one embodiment, the PSM layer 45 has a thickness ranging from approximately 500 Å–3000 Å, depending upon the material being used. The hard mask layer 18 has a thickness of approximately 50 Å–500 Å, depending upon the material being used. It should be noted, however, that these layers may have other thickness as well, depending upon the materials used.

Figure 15:
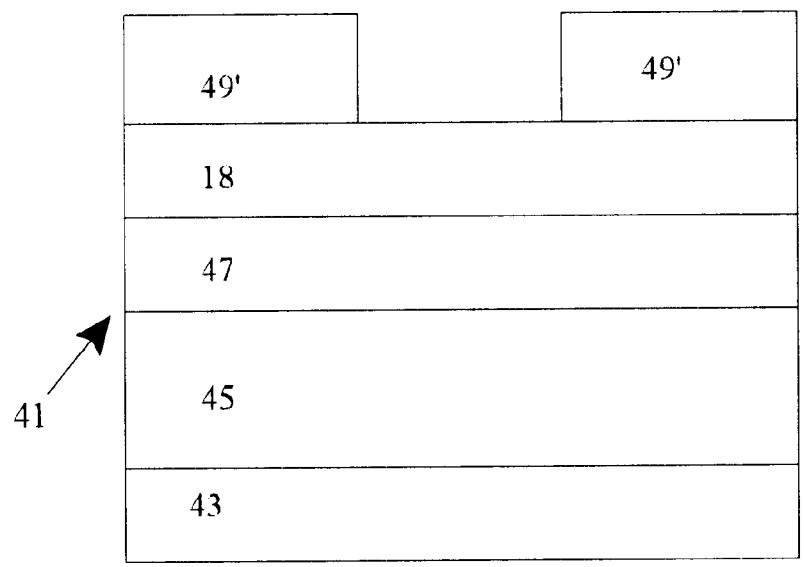
FIG. 15 is a cross sectional view of the EAPSM of FIG. 14 after exposure to an energy source and removal of the soluble photosensitive material.
Figure 16:
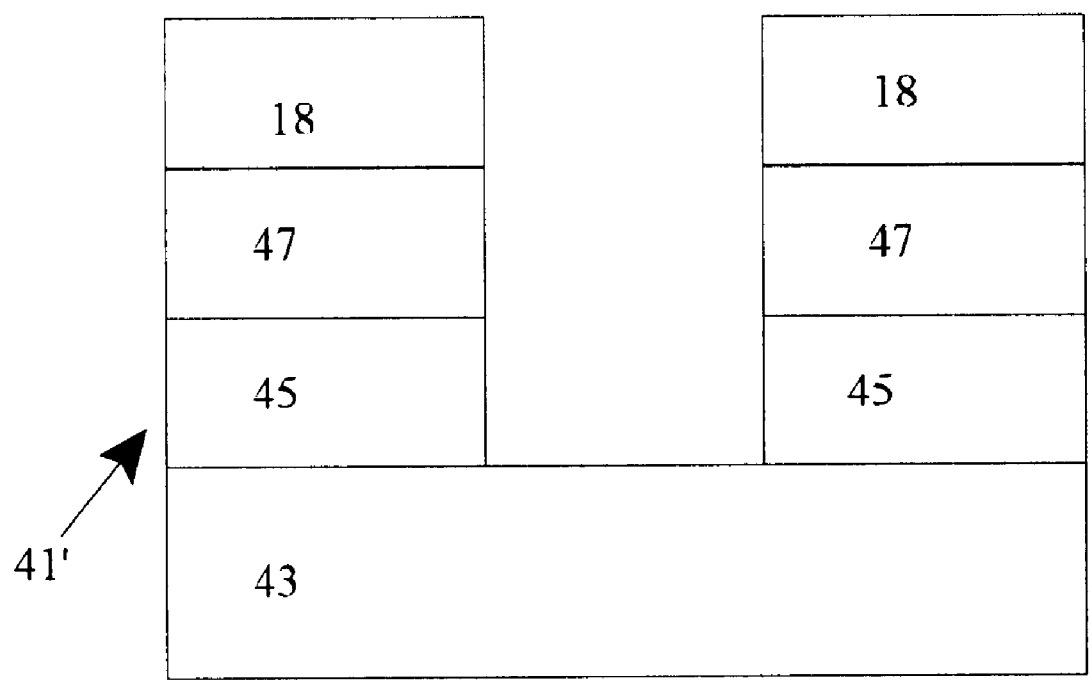
FIG. 16 is a cross sectional view of the EAPSM of FIGS. 14–15 after being subjected to an etching process thereby removing the exposed opaque and phase shift layers.

To process the EAPSM, the same etching techniques used to etch the binary photomask of the present invention are preferably used to etch the EAPSM 41 of the present invention. In this regard, the photoresist 49 is first removed in accordance with a defined pattern as described above and as shown if FIG. 15. Next, as is the case for the binary photomask of the present invention, portions of the hard mask layer 18 are removed to correspond to the pattern formed in the photoresist layer 49', as shown in FIG. 16. Next, unlike the binary photomask of the present invention, it is also necessary to etch the PSM layer 45 in addition to the opaque layer (and anti-reflective layer, if used). In this regard, the second processing step described above with respect to the binary photomask should be modified to account for the PSM layer 18, wherein those portions of the PSM layer which correspond to the portions of the opaque layer 47 (and anti-reflective layer, if applicable) being removed are also removed. It should be noted that the PSM layer 45 can be etched together with the opaque layer 47 as a single step. Alternatively, these layers may be removed by separate etching steps, with the opaque layer 47 being etched first and the PSM layer 45 being etched thereafter. As is the case with binary photomask of the present invention, the EAPSM of the present invention avoids the problem of macro-loading and difficulties associated therewith. Furthermore, if desired, the hard mask 18 can be stripped away (not shown) in the same manner as described herein with reference to FIG. 9.

Once the photomask (either binary or phase shift) of the present invention is finished (e.g., etching is completed), the photomask may be used to process a semiconductor or integrated circuit as laid out in the pattern defined on the photomask. This may be done using the prior art techniques described herein or other known techniques. It is noted that in some cases, depending upon the experience of the photomask maker and other quality control factors, it may be necessary to undertake additional post-etching steps before using the photomask of the present invention to make a semi-conductor. For example, it may be necessary to clean the finished photomask, apply a protective pellicle or take any other quality control steps deemed necessary by the photomask manufacturer.

Additionally, it is noted that the present invention is not limited to the exemplary etching techniques described herein, as both the EAPSM 41 and binary photomask 30 could be etched using other etching techniques now known or hereinafter developed. In this regard, depending on the composition of the opaque material, anti-reflective material, and hard mask material, different plasma gases may be used in the first and second etching processes. For example, chlorine may be used to etch a Si hard mask. A high oxygen concentration mixture of oxygen and chlorine may be used to perform the second etching for Cr. If $SiO_2$ is used as the hard mask, fluorinated species may be used to etch the hard mask.

Now that the preferred embodiments of the present invention have been shown and described in detail, various modifications and improvements thereon will become readily apparent to those skilled in the art. For example, the photomask of the present invention (either binary or phase shift) could be modified to have additional or fewer layers for other purposes, provided that the hard mask 18 is used as described herein. The present embodiments are therefor to be considered in all respects as illustrative and not restrictive, the scope of the invention being indicated by the appended claims, and all changes that come within the meaning and range of equivalency of the claims are therefore intended to be embraced therein.

What is claimed is:

1. A method for creating an image on a blank embedded phase shift photomask comprising a photosensitive resist material layer, a hard mask layer underlying said photosensitive resist material layer, said hard mask layer made from materials which are selectively resistant to etching in said blank photomask, an opaque layer underlying said hard mask layer, a phase shift layer underlying said opaque layer and a substantially transparent substrate layer underlying said phase shift layer, said method for creating an image comprising the steps of:

creating a patterned image in said photosensitive resist layer;

removing portions of said photosensitive resist layer that do not correspond to said patterned image thereby exposing portions of said hard mask layer not corresponding to said patterned image;

removing said exposed portions of said hard mask layer that do not correspond to said patterned image thereby exposing portions of said opaque layer not corresponding to said patterned image;

removing said exposed portions of said opaque and said phase shift layer underlying said hard mask portions that do not correspond to said patterned image thereby exposing portions of said substantially transparent layer that do not correspond to said patterned image; and removing said photosensitive resist layer.

2. The method of claim 1, wherein said hard mask layer is comprised of Si and said step of removing said exposed portions of said hard mask layer is conducted using plasma gases, the composition of which has either fluorine, chlorine, or bromine containing species or a combination of various halide containing species.

3. The method of claim 1, wherein said step of removing said exposed portions of said hard mask layer is conducted using plasma gases selected from the group consisting of $C_2F_6$, $CHF_3$, HBr, $Cl_2$, and $SF_6$.

4. The method of claim 1, wherein said hard mask layer is selected from the group consisting of Ti, TiW, W, $Si_3N_4$, $SiO_2$, TiN, and spin-on-glass and said step of removing said exposed portions of said hard mask layer is conducted using plasma gases, the composition of which has either fluorine, chlorine, or bromine containing species or a combination of various halide containing species 6.

5. The method of claim 4, wherein said step of removing said exposed portions of said hard mask layer is conducted using plasma gases selected from the group consisting of $C_2F_6$, $CHF_3$, HBr, $Cl_2$, and $SF_6$.

6. The method of claim 1, wherein said phase shift layer is selected from the group consisting of molybdenum silicide, tantalum silicon nitride, titanium silicon nitride and zirconium silicon oxide.

7. A method for creating an image on an embedded attenuated phase shift blank photomask comprising a photosensitive resist material layer, a hard mask layer underlying said photosensitive resist material layer, said hard mask layer made from materials which are selectively resistant to etching in said blank photomask, an anti-reflective layer underlying said hard mask layer, an opaque layer underlying said anti-reflective layer, a phase shift layer underlying said opaque layer and a substantially transparent substrate layer underlying said phase shift layer, said method for creating an image comprising the steps of:

creating a patterned image in said photosensitive resist layer;

removing portions of said photosensitive resist layer that do not correspond to said patterned image thereby exposing portions of said hard mask layer not corresponding to said patterned image;

removing said exposed portions of said hard mask layer that do not correspond to said patterned image thereby exposing portions of said anti-reflective layer overlying portions of said opaque layer not corresponding to said patterned image;

removing said exposed portions of said opaque and said phase shift layer underlying said hard mask portions that do not correspond to said patterned image thereby exposing portions of said substantially transparent layer that do not correspond to said patterned image; and removing said photosensitive resist layer.

8. The method of claim 7, wherein said hard mask layer is comprised of Si and said step of removing said exposed portions of said hard mask layer is conducted using plasma gases, the composition of which has either fluorine, chlorine, or bromine containing species or a combination of various halide containing species.

9. The method of claim 7, wherein said step of removing said exposed portions of said hard mask layer is conducted using plasma gases selected from the group consisting of $C_2F_6$, $CHF_3$, HBr, $Cl_2$, and $SF_6$.

10. The method of claim 7, wherein said hard mask layer is selected from the consisting of Ti, TiW, W, $Si_3N_4$, $SiO_2$, TiN, and spin-on-glass and said step of removing said exposed portions of said hard mask layer is conducted using plasma gases, the composition of which has either fluorine, chlorine, or bromine containing species or a combination of various halide containing species.

11. The method of claim 10, wherein said step of removing said exposed portions of said hard mask layer is conducted using plasma gases selected from the group consisting of $C_2F_6$, $CHF_3$, HBr, $Cl_2$, and $SF_6$.

12. The method of claim 7, further comprising removing said exposed portions of said anti-reflective layer and said portions of said opaque and phase shift layers that do not correspond to said patterned image by using plasma gases comprised of $Cl_2$ and $O_2$ thereby exposing portions of said substantially transparent substrate layer not corresponding to said patterned image, wherein said opaque layer is comprised of Cr and said anti-reflective layer is comprised of CrO.

13. The method of claim 7, wherein said phase shift layer is selected from the group consisting of molybdenum silicide, tantalum silicon nitride, titanium silicon nitride and zirconium silicon oxide.

14. A multilayer blank embedded attenuated phase shift photomask comprising:

a photosensitive resist material layer;

a hard mask layer underlying said photosensitive resist material layer, said hard mask layer made from materials which are selectively resistant to etching in said blank photomask;

an opaque layer underlying said hard mask layer;

a phase shift layer underlying said opaque layer; and a substantially transparent substrate layer underlying said opaque layer.

15. The blank embedded attenuated phase shift photomask of claim 14, further including a layer of anti-reflective material between said opaque layer and said hard mask layer.

16. The blank embedded attenuated phase shift photomask of claim 15, wherein said substrate layer is comprised of quartz, said opaque layer is comprised of chrome and said anti-reflective material is comprised of chrome oxide.

17. The blank embedded attenuated phase shift photomask of claim 14, wherein said hard mask layer is between 50 and 500 Å thick and is comprised of TiN.

18. The blank embedded attenuated phase shift photomask of claim 14, wherein said hard mask layer is between 50 and 500 Å thick and is comprised of Ti.

19. The blank embedded attenuated phase shift photomask of claim 14, wherein said hard mask layer is between 50 and 500 Å thick and is comprised of Si.

20. The blank embedded attenuated phase shift photomask of claim 14, wherein said hard mask layer is between 50 and 500 Å thick and is comprised of $Si_3N_4$.

21. The blank embedded attenuated phase shift photomask of claim 14, wherein said hard mask layer is between 50 and 500 Å thick and is comprised of doped, undoped, or a combination of doped and undoped $SiO_2$.

22. The blank embedded attenuated phase shift photomask of claim 14, wherein said hard mask layer is between 50 and 500 Å thick and is comprised of spin-on-glass.

23. The blank embedded attenuated phase shift photomask of claim 14, wherein said hard mask layer is between 50 and 500 Å thick and is comprised of TiW.

24. The blank embedded attenuated phase shift photomask of claim 14, wherein said hard mask layer is between 50 and 500 Å thick and is comprised of W.

25. The blank embedded attenuated phase shift photomask of claim 14, wherein said phase shift layer is selected from the group consisting of molybdenum silicide, tantalum silicon nitride, titanium silicon nitride and zirconium silicon oxide.

26. A multilayer blank embedded attenuated phase shift photomask comprising:

a photosensitive resist material layer;

a hard mask layer underlying said photosensitive resist material layer, said hard mask layer made from materials which are selectively resistant to etching in said blank photomask;

an anti-reflective layer underlying said hard mask layer;

an opaque layer underlying said anti-reflective layer;

a phase shift layer underlying said opaque layer; and a substantially transparent substrate layer underlying said opaque layer.

27. The blank embedded attenuated phase shift photomask of claim 26, wherein said substrate layer is comprised of quartz, said opaque layer is comprised of chrome and said anti-reflective layer is comprised of chrome oxide.

28. The blank embedded attenuated phase shift photomask of claim 26, wherein said hard mask layer is between 50 and 500 Å thick and is comprised of TiN.

29. The blank embedded attenuated phase shift photomask of claim 26, wherein said hard mask layer is between 50 and 500 Å thick and is comprised of Ti.

30. The blank embedded attenuated phase shift photomask of claim 26, wherein said hard mask layer is between 50 and 500 Å thick and is comprised of Si.

31. The blank embedded attenuated phase shift photomask of claim 26, wherein said hard mask layer is between 50 and 500 Å thick and is comprised of $Si_3N_4$.

32. The blank embedded attenuated phase shift photomask of claim 26, wherein said hard mask layer is between 50 and 500 Å thick and is comprised of doped, undoped, or a combination of doped and undoped $SiO_2$.

33. The blank embedded attenuated phase shift photomask of claim 26, wherein said hard mask layer is between 50 and 500 Å thick and is comprised of spin-on-glass.

34. The blank embedded attenuated phase shift photomask of claim 26, wherein said hard mask layer is between 50 and 500 Å thick and is comprised of TiW.

35. The blank embedded attenuated phase shift photomask of claim 26, wherein said hard mask layer is between 50 and 500 Å thick and is comprised of W.

36. A method for manufacturing a semiconductor comprising the steps of:
   interposing a finished embedded attenuated phase shift photomask between a semiconductor wafer and an energy source,
      wherein said finished embedded attenuated phase shift photomask comprises a substantially transparent substrate, a patterned layer of phase shift material affixed to said substantially transparent substrate, a patterned layer of opaque material affixed to said phase shift material, and a patterned layer of hard mask material affixed to said layer of opaque material and said pattern formed in said opaque layer and said hard mask layer corresponds to a scaled negative of the image to be formed on an image plane;
   generating energy in the energy source;
   transmitting said generated energy through said pattern formed in said phase shift, opaque and said hard mask layers of the finished embedded attenuated phase shift photomask to said semiconductor wafer; and
   etching an image on said semiconductor wafer corresponding to said pattern formed in phase shift, opaque and hard mask layers of the finished photomask.

37. A method for manufacturing a semiconductor comprising the steps of:
   interposing a finished embedded attenuated phase shift photomask between a semiconductor wafer and an energy source,
      wherein said finished embedded attenuated phase shift photomask comprises a substantially transparent substrate, a patterned layer of phase shift material affixed to said substantially transparent substrate, a patterned layer of opaque material affixed to said phase shift material, and a patterned layer of hard mask material affixed to said layer of opaque material and said pattern formed in said phase shift layer, said opaque layer and said hard mask layer corresponds to a scaled positive of the image to be formed on an image plane;
   generating energy in the energy source;
   transmitting said generated energy through said pattern formed in said phase shift, opaque and said hard mask layers of the finished photomask to said semiconductor wafer; and
   etching an image on said semiconductor wafer corresponding to said pattern formed in said phase shift, opaque and hard mask layers of the finished photomask.

38. A finished embedded attenuated phase shift photomask to be used to create an image on an image plane by means of a photolithographic process, said photomask comprising:
   (a) a substantially transparent substrate;
   (b) a patterned layer of phase shift material affixed to said substrate;
   (c) a patterned layer of opaque material affixed to said patterned layer of phase shift material; and
   (d) a patterned layer of hard mask material affixed to said layer of said opaque material, wherein said pattern formed in said phase shift material, opaque material and said hard mask material corresponds to a scaled negative or positive of the image to be formed on said image plane.

39. The finished embedded attenuated phase shift photomask of claim 38 wherein said hard mask material is between 50 and 500 Å thick and is comprised of W.

40. The finished embedded attenuated phase shift photomask of claim 38 further comprising a patterned layer of anti-reflective material between said layer of opaque material and said layer of hard mask material.

41. The finished embedded attenuated phase shift photomask of claim 38 wherein said hard mask material is between 50 and 500 Å thick and is comprised of TiW.

42. The finished embedded attenuated phase shift photomask of claim 38 wherein said hard mask material is between 50 and 500 Å thick and is comprised of spin-on-glass.

43. The finished embedded attenuated phase shift photomask of claim 38 wherein said anti-reflective material is comprised of CrO.

44. The finished embedded attenuated phase shift photomask of claim 38 wherein said image plane is a layer of photosensitive resist material formed on a semiconductor wafer.

45. The finished embedded attenuated phase shift photomask of claim 38 wherein said opaque material is comprised of Cr.

* * * * *